US006247229B1

(12) United States Patent
Glenn

(10) Patent No.: US 6,247,229 B1
(45) Date of Patent: Jun. 19, 2001

(54) METHOD OF FORMING AN INTEGRATED CIRCUIT DEVICE PACKAGE USING A PLASTIC TAPE AS A BASE

(75) Inventor: Thomas P. Glenn, Gilbert, AZ (US)

(73) Assignee: Ankor Technology, Inc., Chandler, AZ (US)

( * ) Notice: Subject to any disclaimer, the term of this patent is extended or adjusted under 35 U.S.C. 154(b) by 0 days.

(21) Appl. No.: 09/383,022

(22) Filed: Aug. 25, 1999

(51) Int. Cl.[7] ....................................................... H05K 3/30
(52) U.S. Cl. ................... 29/841; 29/412; 29/837; 29/832; 29/841; 29/842; 29/835; 29/855; 83/929.2; 264/272.11; 264/272.17; 264/157; 174/52.2; 174/52.3; 174/52.4; 257/666; 257/787
(58) Field of Search ...................... 29/412–415, 837–839, 29/842, 832, 835, 841, 855; 83/929.1, 929.2; 264/272.17, 272.11, 157, 236, 347; 174/52.2, 52.3, 52.4; 257/666, 616, 787

(56) References Cited

U.S. PATENT DOCUMENTS

| 4,530,152 | 7/1985 | Roche et al. ............................ 29/588 |
| 5,200,362 | 4/1993 | Lin et al. ................................ 437/207 |
| 5,273,938 | 12/1993 | Lin et al. ................................ 437/207 |
| 5,355,283 | * 10/1994 | Marrs et al. .......................... 174/52.4 |
| 5,474,958 | 12/1995 | Djennas et al. ....................... 437/211 |
| 5,620,928 | 4/1997 | Lee et al. ............................... 438/118 |
| 5,729,437 | * 3/1998 | Hashimoto ............................ 257/787 |
| 5,937,512 | * 8/1999 | Lake et al. .............................. 29/832 |
| 5,977,613 | * 11/1999 | Takta et al. ............................ 257/666 |

FOREIGN PATENT DOCUMENTS 0 546 285 A1 * 6/1993 (EP) ....................................... 29/841

* cited by examiner

Primary Examiner—Lee Young
Assistant Examiner—Rick Kiltae Chang
(74) Attorney, Agent, or Firm—Skjerven Morrill MacPherson LLP; James E. Parsons

(57) ABSTRACT

Methods for forming packages for housing an integrated circuit device are disclosed. In one embodiment, step 1 provides a plastic sheet having an adhesive first surface. Step 2 provides a patterned metal sheet on the first surface of the plastic sheet. The patterned metal sheet includes an array of package sites. Each package site is formed to include a die pad and a plurality of leads around the die pad. Step 3 places an integrated circuit device on each of the die pads. Step 4 connects a conductor between the integrated circuit device and the leads of the respective package site. Step 5 applies an encapsulating material onto the array. Step 6 hardens the encapsulating material. Step 7 removes the first plastic sheet. Step 8 applies solder balls to the exposed surfaces of the leads. Finally, step 9 separates individual packages from the encapsulated array. The side surfaces of the die pad and leads of the package include a reentrant portion for engaging the encapsulant material and locking the die pad and leads to the package.

33 Claims, 5 Drawing Sheets

METHOD OF FORMING AN INTEGRATED CIRCUIT DEVICE PACKAGE USING A PLASTIC TAPE AS A BASE

INTRODUCTION

The present invention concerns a method of forming plastic packages for integrated circuit devices.

BACKGROUND OF THE INVENTION

A problem with conventional plastic packages is that their internal lead frames limit reduction of the size of the packages. Practitioners have attempted to reduce the size of packages by eliminating internal lead frames, as is shown in U.S. Pat. No. 4,530,142 to Roche et al.

Roche et al. begins with a metal temporary substrate. A layer of a low melting-point alloy is applied onto to the metal temporary substrate. Next a plurality of metal die pads and leads are formed on the low-melting point alloy layer. An integrated circuit device is placed on each of the die pads and connected to the leads surrounding the respective die pad. The integrated circuit devices are then encapsulated in a single block of encapsulant material. Individual packages are then cut from the block of hardened encapsulant.

The methods and package of Roche et al. have foreseeable disadvantages. For example, the use of the metal temporary substrate and low-melting point alloy layer increase costs and manufacturing difficulty. Further, the packages are believed to be unreliable because the contacts could easily be pulled from the encapsulant material.

A package marketed by Toshiba Corporation of Japan is believed to be made as follows. A copper sheet is partially etched through in certain locations, forming pockets isolated by unetched copper. A central pocket is surrounded by several smaller satellite pockets. The copper sheet is then masked, leaving the pockets exposed. Next, the pockets are plated with layers of gold, nickel, and gold. An integrated circuit device is placed in the central pocket. (In some embodiments, there is no central pocket, so the device is simply placed on the copper sheet.) Bond wires are connected between the device and the satellite pockets. Next, the device and bond wires are encapsulated. Finally, the remainder of the copper sheet is etched away by acid, forming a completed package. Once the copper is removed, the metal plated into the satellite pockets forms the leads of the package, and the metal plated into the central depression (if any) is the die pad.

This process is believed to have several disadvantages. First, the use of acid to dissolve the remainder of the copper plate after encapsulation creates a significant possibility of contamination, since such acids are generally regarded as dirty. Second, the package is subject to failure, because the leads are attached to the package only by the bond wire and by the adhesiveness of the encapsulant to the inner surface of the plated pocket. Thus, the leads could easily be detached from the bond wire and package body Accordingly, there is a need for a small and reliable package that is easier and less expensive to manufacture than prior art packages.

SUMMARY OF THE INVENTION

The present invention includes a method of manufacturing a package for housing an integrated circuit device. In one exemplary embodiment, Step 1 provides a plastic sheet having an adhesive first surface. The plastic sheet may be plastic tape. Step 2 attaches a metal sheet onto the first surface of the plastic sheet, and then forms an array of package sites by selectively removing portions of the metal sheet. Each package site includes a die pad and a plurality of satellite leads around the die pad. Step 3 attaches an integrated circuit device to each of the die pads. Step 4 connects a conductor, such a bond wire, between each of a plurality of conductive pads on the integrated circuit device and one of the leads of the respective package site. Step 5 applies an encapsulating material onto the first surface of the plastic sheet, integrated circuit devices, the leads, and the electrical conductors of each package site. Step 6 hardens the encapsulating material. Step 7 removes the plastic sheet. Optional Step 8 applies solder balls to the exposed surfaces of the leads of the package sites. Finally, Step 9 separates individual packages from the encapsulated array. An alternative embodiment in an LCC style package requires no solder balls.

An embodiment encompassed within the present invention includes forming a reentrant portion (or reentrant portions) and asperities on the side surfaces of the die pads and leads of the package sites. During the encapsulation step, the encapsulant material flows into the reentrant portions and asperities. The reentrant portions and asperities engage the encapsulant material and lock the die pad and leads to the encapsulant material of the package.

The present invention overcomes the disadvantages of the prior art by, among other things, the use of an inexpensive plastic sheet as a base for forming the packages, and by the formation of encapsulant locking features on the side surfaces of the die pad and leads. These and other advantages will become clear through the following detailed description.

DETAILED DESCRIPTION

Figure 1:
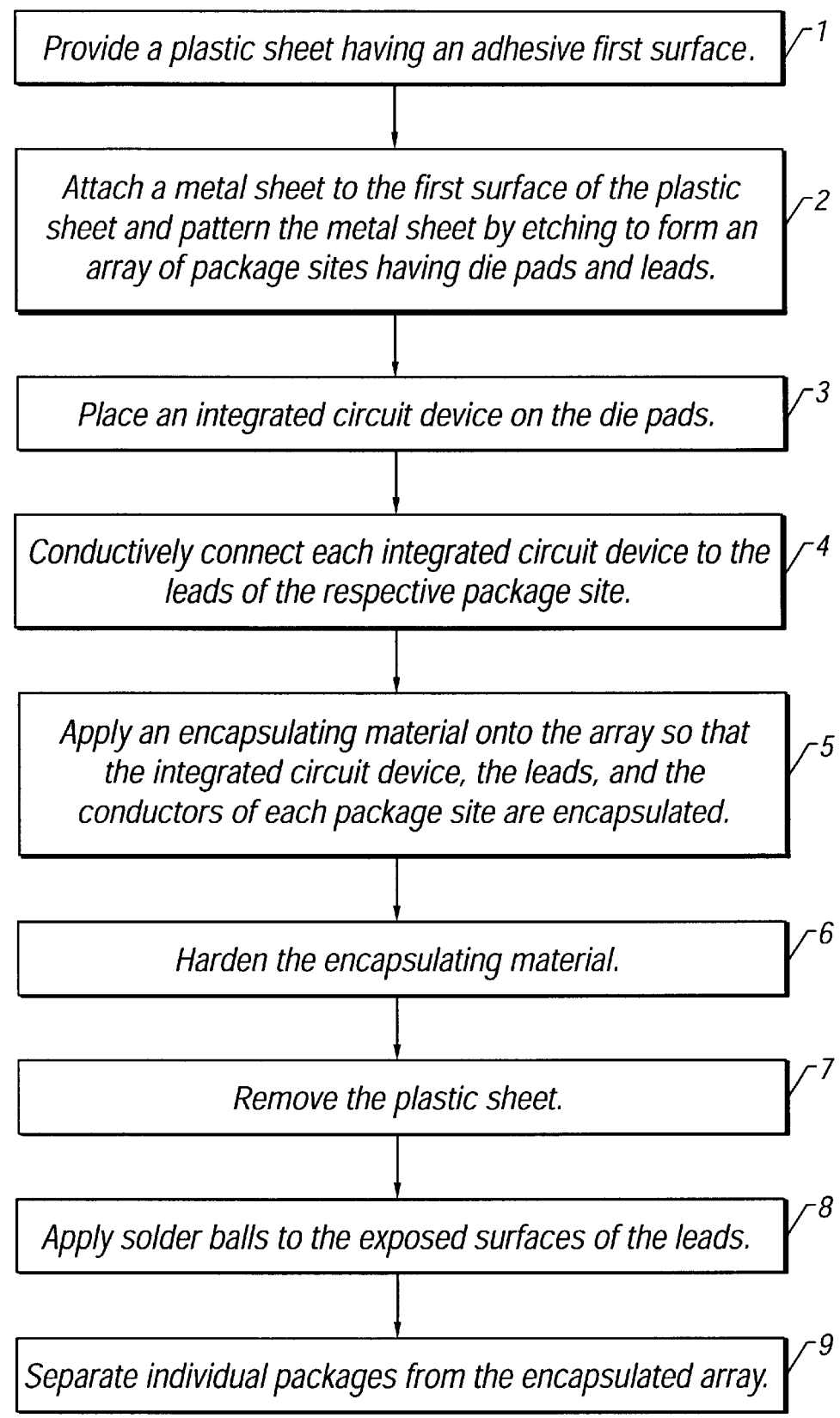
FIG. 1 is a flow chart of a method of forming a package for an integrated circuit device.

FIG. 1 is a flow chart of a method, within the present invention, of forming a package for an integrated circuit device. An example of a completed package 37 formed by the process of FIG. 1 is shown in FIG. 9.

Figure 9:
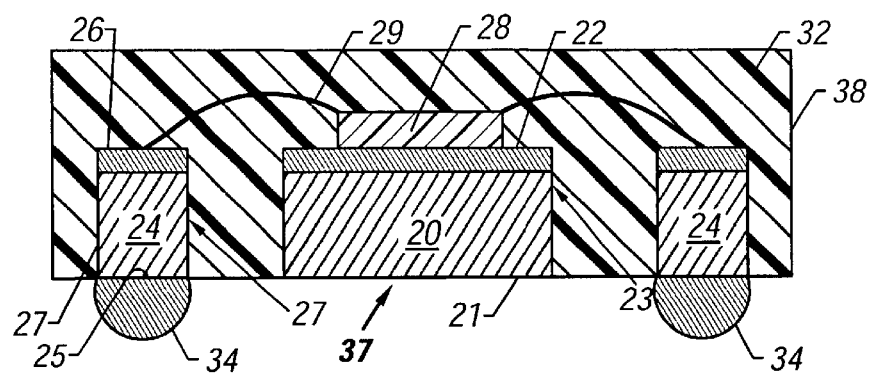
FIG. 9 is a cross-sectional side view of a completed package.

As will become clear from the discussion the assembly method of FIG. 1, package 37 of FIG. 9 includes a semiconductor integrated circuit device 28 mounted on a metal die pad 20. A plurality of metal leads 24 are adjacent to die pad 20 and are connected by bond wires 29 to conductive pads (not shown) on device 28. Encapsulant material 32 forms the package body, and covers device 28, bond wires 29, and the upper and side surfaces of die pad 20 and leads 24. The lower surface of die pad 20 is exposed. Solder balls 34 are attached to the lower surface of leads 24, although solder balls are optional.

Figure 2:
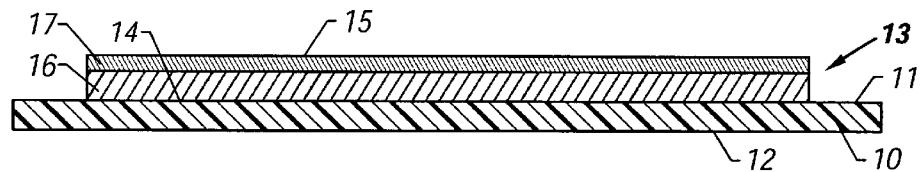
FIG. 2 is cross-sectional side view of a plated metal sheet on a plastic sheet.

Again, FIG. 1 provides a method of making a package like package 37 of FIG. 9. Referring to FIGS. 1 and 2, Step 1 of FIG. 1 provides a plastic sheet formed of a plastic material. Plastic sheet 10 has a first surface 11 and an opposite second surface 12. An adhesive is present on or applied to first surface 11 of plastic sheet 10.

Plastic sheet 10 may be a segment having a size of, for example, 5 cm by 20 cm, and a thickness of about 25 to 75 microns. The size and thickness of plastic sheet 10 can vary. Alternatively, plastic sheet 10 may be a plastic tape that is on a roll. As described below, the process of FIG. 1 may be performed as a reel to reel process.

Plastic sheet 10 is formed of a conventional plastic material such as polyvinyl chloride, polyvinyl alcohol acetate, polypropylene acetate, vinyl, polyethylene, mylar, or polyimide. An example brand of plastic tape is KAPTON® polyimide tape from the Dupont Company.

Figure 3:
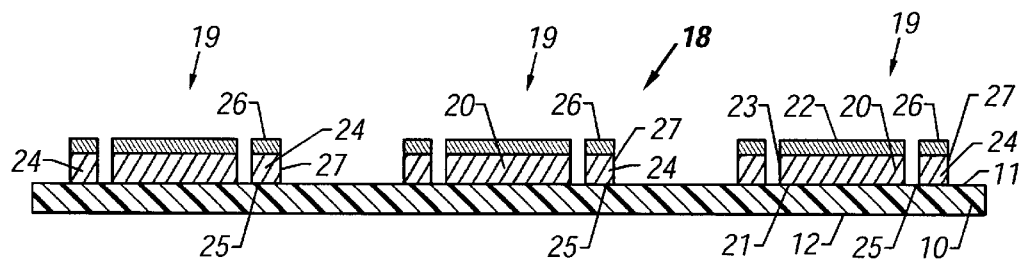
FIG. 3 is a cross-sectional side view of an array of package sites each including a die pad and leads.

Step 2 of FIG. 1 provides a patterned metal sheet on the first surface of the plastic sheet. FIGS. 2 and 3 show one embodiment of a method of performing Step 2 of FIG. 1.

Referring to FIG. 2, a metal sheet 13 is first attached to the adhesive first surface 11 of plastic sheet 10. Metal sheet 13 of FIG. 2 has a first surface 14 attached to first surface 11 of plastic sheet 10, and an opposite second surface 15.

In FIG. 2, metal sheet 13 consists of an underlying first metal layer 16 on first surface 11 of plastic sheet 10, and a second metal layer 17 that is plated onto a top surface of first metal layer 16 opposite first surface 11 of plastic sheet 10. First metal layer 16 of metal sheet 13 may be formed, for example, of copper, a copper alloy, or Alloy 42. Plated metal layer 17 may be nickel gold, silver, platinum, palladium, or another noble metal. Although not shown in FIG. 2, first surface 14 of metal sheet 13 also may be plated. Metal sheet 13 may have a thickness of, for example, 100 to 250 microns.

Next, metal sheet 13 is etched to form an array of package sites. For example, such etching is performed by chemical etching using a patterned photoresist mask. In such a process, a layer of photoresist is applied onto second surface 15 of metal sheet 13. Next, the photoresist is exposed to light through a patterned reticle or the like, and is subsequently developed to form a mask. Chemicals are sprayed or otherwise applied to the masked metal strip, and exposed portions of metal are etched away, leaving the desired pattern. Typically, acids are used to etch the metal. Obviously, plastic film 10 must not be substantially attacked by the chemical used to etch metal sheet 13. A cleaning step may be necessary to remove residue or other undesirable materials after Step 2 (or any of the other steps) of FIG. 1.

Figure 4:
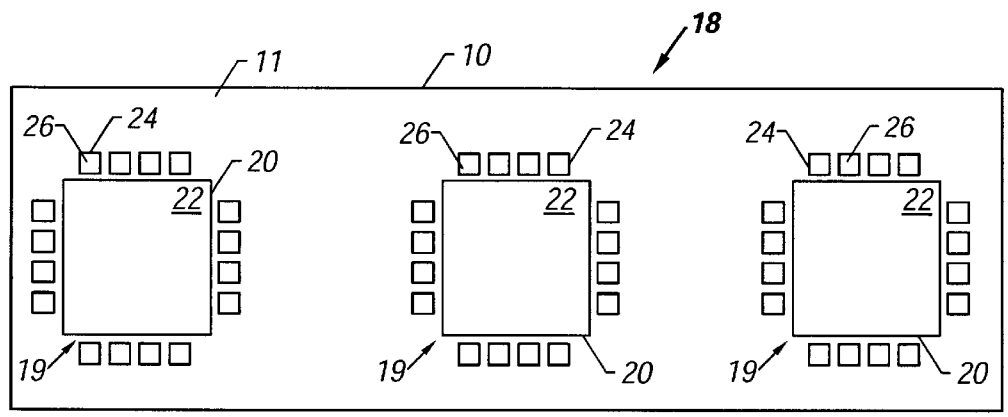
FIG. 4 is a top plan view of the array of package sites shown in FIG. 3.

FIG. 3 is a cross-sectional side view of an array 18 of three identical package sites 19 formed by the above-described chemical etching of metal sheet 13. FIG. 4 is a top plan view of array 18 of FIG. 3.

Referring to FIGS. 3 and 4, each package site 19 includes a metal die pad 20 and metal leads 24. Die pad 20 and leads 24 are formed from metal layer 16 and metal layer 17 of metal sheet 13 of FIG. 2. FIG. 4 shows that each die pad 20 has a rectangular perimeter and is surrounded on each of its four sides by four leads 24. Leads 24 also have a rectangular perimeter.

The perimeter shapes of die pad 20 and leads 24 can vary. For example, leads 24 can have a rectangular or circular perimeter. Also, the number and positioning of the leads can vary. For example, 64 or 128 leads may be selected.

In FIG. 3, each die pad 20 has a first surface 21 attached to first surface 11 of plastic sheet 10, an opposite second surface 22, and side surfaces 23 at the periphery of die pad 20 between first surface 21 and second surface 22. Each lead 24 has a first surface 25 attached to first surface 11 of plastic sheet 10, an opposite second surface 26, and side surfaces 27 at the periphery of lead 24 between first surface 25 and second surface 26.

Step 3 of FIG. 1 places an integrated circuit device onto each of the die pads. Step 4 of FIG. 1 connects a conductor, such a bond wire, between each of a plurality of conductive pads on each integrated circuit device and one of the leads of that integrated circuit device's respective package site.

Figure 5:
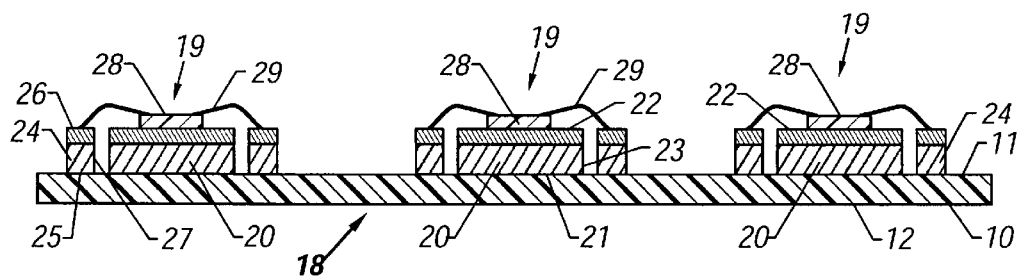
FIG. 5 is a cross-sectional side view of three integrated circuit devices placed on and wire-bonded to leads of respective package sites.

FIG. 5 is a cross-sectional side view of three integrated circuit devices 28 placed on second surface 22 of these die pads 20. Each integrated circuit device 28 is placed on a die pad 20 and is adhesively attached to second surface 22 of die pad 20 using conventional die attach equipment and adhesives.

Each integrated circuit device 28 of FIG. 5 includes conductive pads (not shown) that are connected to internal circuitry of the integrated circuit device. Each conductive pad is connected by a conventional metal bond wire 29 to a second surface 26 of a lead 24. Conventional bond wire equipment is used.

Step 5 of FIG. 1 applies an insulative and adhesive encapsulating material onto the array of the package sites in order to encapsulate each of the integrated circuit device, the leads, and the electrical conductors of each package site. Step 6 of FIG. 1 hardens the encapsulating material forming the package bodies and the exterior surfaces of the packages.

Figure 6:
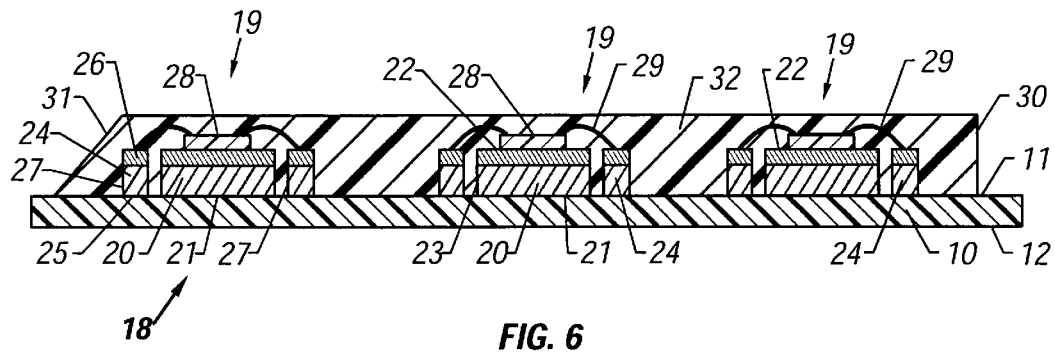
FIG. 6 is a cross-sectional side view of an array of package sites after encapsulation by either liquid encapsulation or molding techniques.

FIG. 6 is a cross-sectional side view of three package sites 19 of an encapsulated array 18 after Steps 5 and 6. The three package sites 19 are covered in a single block of encapsulant material 32. In particular, first surface 11 of sheet 10 and each integrated circuit device 28, die pad 20, leads 24, and bond wires 29 are covered by encapsulating material 32. Second surface 22 and side surfaces 23 of die pad 20, and second surface 26 and side surfaces 27 of leads 24 are covered by encapsulant material 32. Encapsulant material 32 does not, however, cover second surface 12 of plastic sheet 10, and plastic sheet 10 prevents encapsulant material from covering first surface 21 of die pad 20 and first surface 25 of leads 24.

Although in this embodiment three packages sites 19 are encapsulated in a single block of encapsulating material 32, the package sites may be encapsulated individually in an alternative embodiment of the process. In such an alternative embodiment, individual package sites may be encapsulated by injection or transfer molding, among other possible methods.

Steps 5 and 6 of FIG. 1 may be performed in several alternative ways. Peripheral side surface 30 of encapsulated array 18 is orthogonal, to illustrate a liquid encapsulation process. Peripheral side surface 31 is sloped to illustrate a molding process for encapsulating array 18.

Figure 10:
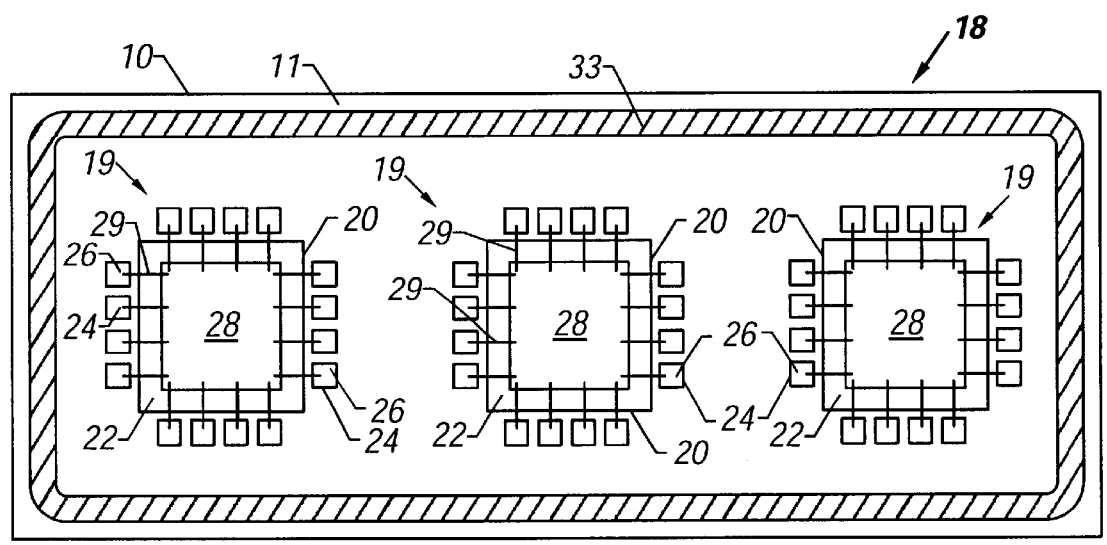
FIG. 10 is a top plan view of an array of package sites with a bead of adhesive material around the array.

For example, Step 5 may be performed using a liquid encapsulant. In such a method, a first step applies a contiguous bead of a conventional hardenable viscous adhesive material onto first surface 11 of plastic sheet 10 around one of more package sites 19. An example bead material is HYSOL 4451 epoxy from the Dexter-Hysol Company of City of Industry, Calif. FIG. 10 is a top plan view of an array 18 of three package sites 19 with a bead 33 of adhesive material around the array 18. Bead 33 is cross-hatched in FIG. 10. Bead 33 encloses each package site 19. Bead 33 forms a cavity with first surface 11 of plastic sheet 10 in which the three package sites 19 and integrated circuit devices 28 are enclosed. Next, bead 33 is solidified, such as by heating at 150° C. for one hour. Next, a conventional, hardenable, adhesive, and insulative liquid encapsulating material suitable for encapsulating packages is poured within bead 33 and fills the cavity formed by bead 33 so that package sites 19, integrated circuit devices 28, leads 24, die pads 20, and bond wires 29 are covered with encapsulant material. An example liquid encapsulant material is HYSOL 4450 encapsulant. As a final step, the encapsulant material is hardened, such as by heating at 150° C. for one hour. This embodiment of Steps 5 and 6 forms a single solid block of encapsulant material 32 above and on array 18.

Alternatively, Steps 5 and 6 of FIG. 1 may be accomplished using conventional plastic molding techniques and materials, such as injection molding or transfer molding. In such a method, a first step places array 18 in a conventional two-pocket mold. The lower pocket of the mold is blanked out by a bar so that encapsulant material does not enter the lower pocket. Next, insulative encapsulant material, i.e., molding compound, is provided to the upper pocket of the mold. Encapsulant material 32 is molded onto package sites 19 of array 18 above and on first surface 11 of plastic sheet 10. Integrated circuit devices 28, leads 24, die pads 20, and bond wires 29 are covered with encapsulant material 32. Next, encapsulant material 32 is hardened in a conventional manner. Where injection molding techniques are used, example encapsulation materials include styrene, liquid crystal polymer, or nylon 66. Where transfer molding techniques are used, SUMITOMO 8300 molding material from the Sumitomo Company of Japan may be used.

Step 7 of FIG. 1 removes plastic sheet 10 from encapsulated array 18. An example method of performing Step 7 is to dissolve plastic sheet 10 in a solvent, such as acetone. The material of plastic sheet 10 should be chosen in view of its ability to be dissolved, and the solvent must be compatible with the encapsulant material 32.

Another method of performing Step 7 is to heat plastic sheet 10 and then peel plastic sheet 10 from array 18. For example, the heating could be to a temperature of 80° C. If Step 5 is done by molding, then plastic sheet 10 could be removed while array 18 is in the mold or after array 18 is removed from the mold.

Figure 7:
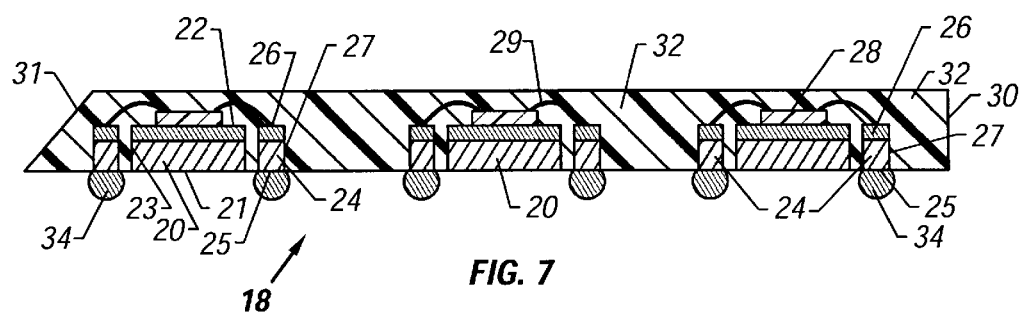
FIG. 7 is a cross-sectional side view of the array of FIG. 5 after removal of the plastic sheet and attachment of solder balls to the leads.

Step 8 is an optional step that applies conventional solder balls to the exposed surfaces of the leads of encapsulated package sites 19. FIG. 7 is a cross-sectional side view of array 18 of packages sites 19 after removal of plastic sheet 10 and attachment of solder balls 34 to the exposed first surfaces 25 of leads 24. Solder balls 34 are used for connection of the package to external circuitry.

Alternatively, Step 8 may be omitted. In such a case, first surface 25 of leads 24 serve as connectors to external circuitry, as in a leadless chip carrier package style.

Finally, Step 9 of FIG. 1 separates individual packages from the encapsulated array. Step 9 may be performed, for example, by cutting encapsulated array with a saw. Disposable material, such as bead 33 is cut away.

Figure 8:
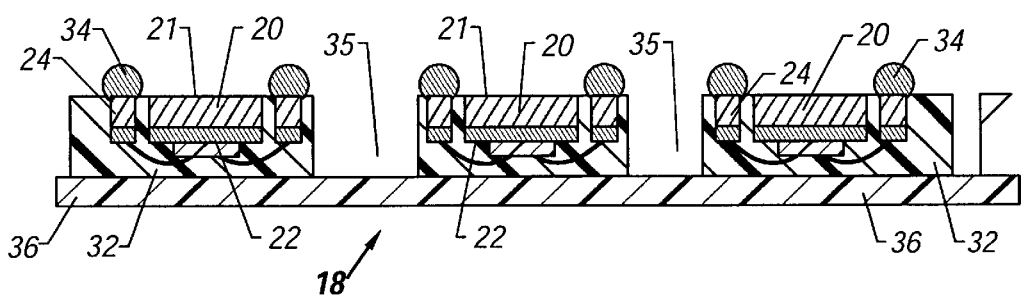
FIG. 8 is a cross-sectional side view an inverted array of packages after the encapsulant material is cut with a saw.

FIG. 8 is a cross-sectional side view of array 18 of FIG. 7 after encapsulant material 32 is cut with a saw. Encapsulated array 18 is inverted and orthogonal cuts 35 in encapsulant material 32 are made. Prior to cutting, an adhesive plastic film 36 is applied to the top surface of encapsulated array 18 to immobilize the packages during the cutting step. Such films are used, for example, in conventional wafer cutting processes. Adhesive plastic film 36 is placed on the top surface of encapsulated array 18 before Step 7, Step 8, or Step 9. The cutting step segments encapsulant material 32 without fully severing plastic film 36. The cuts segment the encapsulant material without fully severing the tape. When adhesive film 36 is removed from the package tops, the formation of individual packages 37 is completed. FIG. 9 shows a completed package 37 having orthogonal side surfaces 38 at the periphery of package 37.

As mentioned above, plastic sheet 10 may be a continuous tape on a reel. Where plastic sheet 10 is a continuous tape on a reel, then the process of FIG. 1 can be a reel to reel process. For example, Step 1 of FIG. 1 may include unrolling a plastic tape from a first reel, attaching a metal tape to an adhesive surface of the unrolled plastic tape, and then rolling up the joined plastic and metal tapes on a second reel. Step 2 may include unrolling the second reel of joined plastic and metal tapes, patterning a selected length of the metal to form package sites 19, and then rolling the etched length of package sites 19 onto a third reel. The second reel is advanced until the entire length of the second reel is etched to form a third reel of package sites 19. The third reel of package sites 19 is then unrolled, and segments of selected length, for example three or four or eight package sites 19, are subjected to die attach, bond wire attach, and encapsulation (i.e., Steps 3–6 of FIG. 1). After Step 6 (encapsulant hardening), the selected length of encapsulated package sites 18 can be cut from the third reel, and processed as an individual encapsulated array 18 through the remaining steps of FIG. 1.

Figure 12:
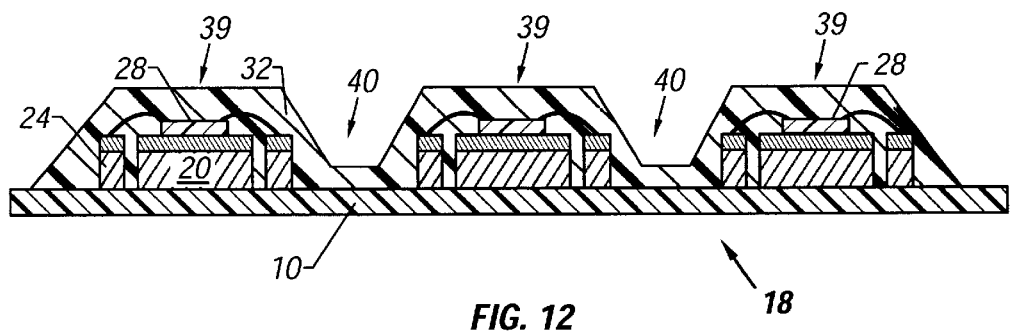
FIG. 12 is a cross-sectional side view of an array of individually molded package bodies.

Alternatively, if, for example, Step 5 of FIG. 1 is performed by molding, then a mold having multiple two-pocket cavities can be used which molds individual package housings on a selected number of package sites 19. The lower pocket is blocked with a bar so encapsulant material only is applied above first surface 11 of plastic sheet 10. This is shown in FIG. 12, where three package sites 19 are molded into individual package bodies 39. Molded webbing 40 is between the individual package. In such a process, after Step 6, the reel of molded package sites is advanced onto a fourth reel, and a second segment of packages is molded. The third reel of package sites is then advanced until all of the package sites are subjected to die attach, wire bond, and molding. Next, the fourth roll of molded packages is unrolled, and Steps 7–9 of FIG. 1 are performed as discussed above.

In package 37 of FIG. 9, side surfaces 23 of die pad 20 and side surfaces 27 of leads 24 are shown as having an orthogonal orientation. Alternatively, side surfaces 23 and 27 are formed with a reentrant portion for enhancing the connection between encapsulant material 32 and die pad 20 and leads 24. Such reentrant surfaces may be formed, for example, by a controlled chemical etch process, or by a standard chemical etch process followed by coining of the patterned metal sheet.

Figure 11:
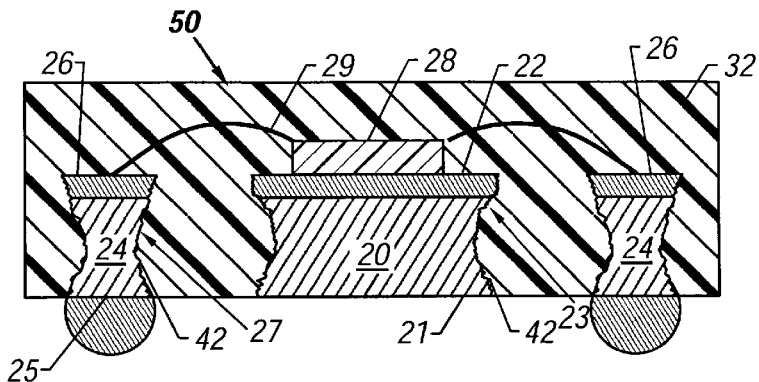
FIG. 11 is a cross-sectional side view of a completed package showing a first alternative side surface of a die pad and leads.

FIG. 11 shows an enlarged cross-sectional side view of a completed package 50 having alternative side surfaces 23 of a die pad 20 and side surfaces 27 of leads. The reentrant portions of side surfaces 23 and 27 are formed during Step 2 of FIG. 1, when patterned array 18 is formed from plated metal sheet 13. Package 50 is the same as package 37 of FIG. 9, except for the side surfaces of the die pad and leads.

In FIG. 11, the reentrant portion of side surfaces 23 of die pad 20 and side surfaces 27 of leads 24 includes a central depression 42. In addition, side surfaces 23 and 27 have a roughly-textured surface that includes numerous asperities on the reentrant surface. Encapsulant material flows into central depression 42 and into the areas of the asperities during Step 5 of FIG. 1. The reentrant portion and the asperities engage encapsulant material 32 and lock die pad 20 and leads 24 to encapsulant material 32.

Referring to FIG. 11, reentrant side surfaces 23 of die pad 20 and side surfaces 27 of leads 24 can be formed during step 2 by etching metal sheet 13 with a conventional liquid etchant using a controlled etch process. The etch process is continued beyond the time that would be required to form orthogonal side surfaces for the die pad and leads. This is usually accomplished by using an oversized mask on upper second surface 15 of metal sheet 13 (FIG. 2) and using a slight overetch. The size and shape of depression 42 of FIG. 11 is controlled by the amount of over-etching.

Figure 13:
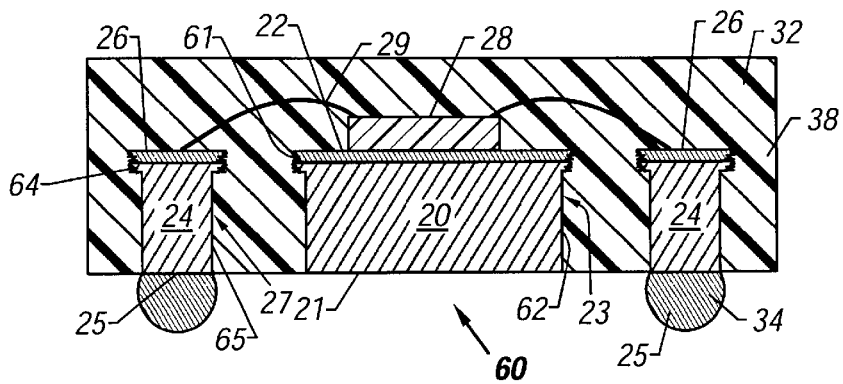
FIG. 13 is a cross-sectional side view of a completed package showing a second alternative side surface of a die pad and leads.

FIG. 13 shows a second alternative package 60 that may be formed by the method of FIG. 1. Package 60 is identical to package 50 of FIG. 11, except that the side surfaces of die pad 20 and leads 24 have a different reentrant profile. Referring to FIG. 13, side surfaces 23 of die pad 20 have a projecting lip 61 adjacent to upper second surface 22. Lip 61 includes a roughly textured surface with asperities. Side surface 23 of die pad 20 has a reentrant orthogonal portion 62 beneath lip 61, i.e., between lip 61 and lower first surface 21. Leads 24 also have a similar projecting lip 64 with asperities. Side surfaces 27 of leads 24 also have a reentrant orthogonal portion 65 beneath lip 64, i.e., between lip 64 and lower first surface 25. During Step 5 of the above described process, encapsulant material 32 covers lips 61 and 64, and flows beneath lips 61 and 64 to contact reentrant orthogonal portions 62 and 65. The encapsulant material beneath lips 61 and 64 lock die pad 20 and leads 24 to encapsulant material 32.

The reentrant side surfaces of die pad 20 and leads 24 of FIG. 13 are formed during Step 2 of the process of FIG. 1. In particular, a first step provides a patterned metal sheet having orthogonal side surfaces on die pad 20 and leads 24, as would be produced in a standard chemical etching process. A second step coins upper second surface 22 of die pad 20 and upper second surface 26 of leads 24. Coining involves applying a high pressure impact to upper second surfaces 22 and 26. This high pressure impact deforms the side surfaces of die pad 20 and leads 24 to form lips 61 and 64 (FIG. 13).

The embodiments described herein are merely examples of the present invention. Artisans will appreciate that variations are possible within the scope of the claims.

What is claimed is:

1. A method of forming a plurality of integrated circuit device packages comprising:

providing a plastic sheet having a first surface;

attaching a metal sheet to the first surface of the plastic sheet;

patterning the metal sheet so as to form an array of package sites, wherein each package site formed includes a die pad and a plurality of leads adjacent to the die pad, wherein the die pad and the leads so formed have a first surface, a second surface opposite the first surface and on the first surface of the plastic sheet, and peripheral side surfaces, and the side surfaces of the die pad and the leads include a reentrant portion and asperities placing an integrated circuit device on the first surface of each die pad of the array;

conductively connecting the integrated circuit device to the leads adjacent to the die pad on which the integrated circuit device is placed;

applying an encapsulating material onto the array and the first surface of the plastic sheet so that each package site is encapsulated and the reentrant portion and the asperities of the side surfaces of the die pad and the leads are covered with the encapsulating material;

removing the plastic sheet; and separating the package sites to form the packages from the encapsulated array, wherein the second surface of the die pad and the leads of each package is exposed.

2. The method of claim 1, wherein applying the encapsulating material comprises pouring a liquid encapsulating material onto the array.

3. The method of claim 2, further comprising applying a bead of an adhesive material around said array, and then pouring said liquid encapsulating material within said bead.

4. The method of claim 1, wherein applying the encapsulating material comprises molding said encapsulating material.

5. The method of claim 4, wherein applying the encapsulating material includes molding an individual package housing for each package site.

6. The method of claim 1, wherein removing the plastic sheet includes dissolving the plastic sheet.

7. The method of claim 1, wherein removing the plastic sheet includes peeling the plastic sheet from the array.

8. The method of claim 1, wherein the plastic sheet with the attached metal sheet is unrolled from a reel, and further comprising a step of rolling said plastic sheet and attached patterned metal sheet onto a second reel.

9. The method of claim 8, wherein the second reel of joined plastic sheet and patterned metal sheet is rolled onto a third reel after applying the encapsulating material.

10. The method of claim 1, wherein patterning the first metal sheet includes etching the metal sheet with a liquid etchant.

11. The method of claim 1, wherein patterning the metal sheet includes coining the die pad and the leads.

12. The method of claim 1, wherein the side surfaces of the die pad and the leads include a central depression.

13. The method of claim 1, wherein patterning the metal sheet includes forming a lip with the asperities thereon on the die pad and the leads adjacent to the first surface of the die pad and the leads.

14. The method of claim 1, wherein applying the encapsulating material comprises pouring a liquid encapsulating material onto the array.

15. The method of claim 1, wherein applying the encapsulating material comprises molding the encapsulating material.

16. A method of forming an integrated circuit device package comprising:

providing a plastic sheet having a first surface;

attaching a metal sheet to the first surface of the plastic sheet;

patterning the metal sheet to form a die pad and a plurality of leads adjacent to the die pad, wherein the die pad and the leads so formed have a first surface, a second surface opposite the first surface and on the first surface of the plastic sheet, and peripheral side surfaces, and the side surfaces of the die pad and the leads include a reentrant portion and asperities;

placing an integrated circuit device on the first surface of the die pad;

conductively connecting the integrated circuit device to one or more of the leads;

applying an encapsulating material so that the integrated circuit device and the first surface of the plastic sheet are covered by the encapsulating material and the reentrant portion and the asperities of the side surfaces of the die pad and the leads are covered with the encapsulating material; and removing the plastic sheet thereby exposing the second surface of the die pad and the leads.

17. The method of claim 16, wherein applying the encapsulating material comprises molding the encapsulating material.

18. The method of claim 16, wherein removing the plastic sheet includes peeling off the plastic sheet.

19. The method of claim 16, wherein removing the plastic sheet includes dissolving off the plastic sheet.

20. The method of claim 16, wherein the plastic sheet with the attached metal sheet is unrolled from a reel, and further comprising a step of rolling said plastic sheet and attached patterned metal sheet onto a second reel.

21. The method of claim 20, wherein the second reel of joined plastic sheet and patterned metal sheet is rolled onto a third reel after applying the encapsulating material.

22. A method of forming a plurality of integrated circuit device packages comprising:

providing a plastic sheet having a first surface;

applying a metal layer on the first surface of the plastic sheet;

patterning the metal layer so as to form an array of package sites, wherein each package site formed includes a die pad and a plurality of leads adjacent to the die pad, wherein the die pad and the leads so formed have a first surface, a second surface opposite the first surface and on the first surface of the plastic sheet, and peripheral side surfaces, and the side surfaces of the die pad and the leads include a reentrant portion and asperities;

placing an integrated circuit device on the first surface of each die pad of the array;

electrically connecting the integrated circuit device to the leads adjacent to the die pad on which the integrated circuit device is placed;

applying an encapsulating material onto the away and the first surface of the plastic sheet so that the package sites are encapsulated and the reentrant portion and asperities of the die pad and the leads are covered with the encapsulating material;

removing the plastic sheet from the encapsulated array; and separating the package sites to form the packages from the encapsulated array, wherein the second surface of the die pad and the leads of each package is exposed at an external surface of the package.

23. The method of claim 22, wherein removing the plastic sheet includes dissolving the plastic sheet.

24. The method of claim 22, wherein removing the plastic sheet includes peeling the plastic sheet from the array.

25. The method of claim 22, wherein applying the metal layer to the first surface of the plastic sheet comprises:

providing a sheet of metal; and attaching the sheet of metal to the first surface of the plastic sheet with an adhesive.

26. A method of forming a plurality of integrated circuit device packages comprising:

providing a plastic sheet having a first surface;

attaching a metal sheet to the first surface of the plastic sheet;

patterning the metal sheet so as to form an array of package sites, wherein each package site formed includes a die pad and a plurality of leads adjacent to the die pad;

coining the die pad and the leads of the package sites so as to form a lip having asperities thereon at a peripheral side surface of the die pad and the leads;

placing an integrated circuit device on each die pad of the array;

conductively connecting the integrated circuit device to the leads adjacent to the die pad on which the integrated circuit device is placed;

molding an encapsulating material onto the array and the first surface of the plastic sheet so that each package site is encapsulated and the encapsulating material fills in under said lip;

removing the plastic sheet; and separating the package sites to form the packages from the encapsulated array, wherein a surface of the die pad and the leads of each package is exposed.

27. The method of claim 26, wherein the plastic sheet is removed by dissolving the plastic sheet.

28. The method of claim 26, wherein the plastic sheet is removed by peeling off the plastic sheet.

29. The method of claim 26, wherein the plastic sheet with the attached metal sheet is unrolled from a reel, and further comprising a step of rolling said plastic sheet and attached patterned metal sheet onto a second reel.

30. The method of claim 29, wherein the second reel of joined plastic sheet and patterned metal sheet is rolled onto a third reel after applying the encapsulating material.

31. A method of forming an integrated circuit device package comprising:

providing a plastic sheet having a first surface;

attaching a metal sheet to the first surface of the first plastic sheet;

patterning the metal sheet to form a die pad and a plurality of leads adjacent to the die pad;

coining the die pad and leads so as to form a lip having asperities thereon at a peripheral side surface of the die pad and leads;

placing an integrated circuit device on the die pad;

conductively connecting the integrated circuit device to one or more of the leads;

molding an encapsulating material so that the integrated circuit device and the first surface of the plastic sheet are covered by the encapsulating material; and removing the plastic sheet.

32. The method of claim 31, wherein the plastic sheet is removed by dissolving the plastic sheet.

33. The method of claim 31, wherein the plastic sheet is removed by peeling off the plastic sheet.

* * * * *

UNITED STATES PATENT AND TRADEMARK OFFICE
CERTIFICATE OF CORRECTION

PATENT NO. : 6,247,229 B1
DATED : June 19, 2001
INVENTOR(S) : Thomas P. Glenn

It is certified that error appears in the above-identified patent and that said Letters Patent is hereby corrected as shown below:

<u>Column 1,</u>
Lines 12 and 14, please delete "lead frames" and insert -- leadframes --; and <u>Column 9,</u>
Line 55, please delete "away" and insert -- array --.

Signed and Sealed this

Twenty-eighth Day of January, 2003

JAMES E. ROGAN
*Director of the United States Patent and Trademark Office*